US011699904B2

(12) United States Patent
Fleck et al.

(10) Patent No.: US 11,699,904 B2
(45) Date of Patent: Jul. 11, 2023

(54) SYSTEMS AND METHODS FOR PHASE IDENTIFICATION USING RELATIVE PHASE ANGLE MEASUREMENTS

(71) Applicant: Aclara Technologies LLC, St. Louis, MO (US)

(72) Inventors: Christopher Fleck, St. Louis, MO (US); Roger Smith, Gibsonia, PA (US); Rebecca Ross, Apollo, PA (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

(21) Appl. No.: 17/365,520

(22) Filed: Jul. 1, 2021

(65) Prior Publication Data

US 2022/0006290 A1 Jan. 6, 2022

Related U.S. Application Data

(60) Provisional application No. 63/047,442, filed on Jul. 2, 2020.

(51) Int. Cl.
*H04L 7/02* (2006.01)
*H02J 3/08* (2006.01)

(52) U.S. Cl.
CPC . *H02J 3/08* (2013.01); *H04L 7/02* (2013.01)

(58) Field of Classification Search
CPC . H04L 7/02; H02J 13/00002; H02J 13/00022; H02J 3/08; H02J 3/242
See application file for complete search history.

(56) References Cited

U.S. PATENT DOCUMENTS 6,631,639 B1 * 10/2003 Dam ................... G01F 23/2961 73/290 V
2013/0013125 A1 1/2013 Booth
2013/0024149 A1 1/2013 Nayar et al.
2013/0049732 A1 2/2013 Kulkami et al.
2015/0097574 A1 4/2015 Kashiwagi et al.
2015/0237130 A1 * 8/2015 Hui ..................... H04L 67/1095 709/248
2018/0031617 A1 2/2018 Rieken et al.

OTHER PUBLICATIONS

PCT/US2021/040116 International Search Report and Written Opinion dated Oct. 13, 2021.

* cited by examiner

*Primary Examiner* — Jamal Javaid
(74) *Attorney, Agent, or Firm* — Michael Best & Friedrich LLP

(57) ABSTRACT

Systems for determining a phase of a device coupled to an electrical distribution system. The system includes a number of gateway devices configured to transmit a synchronization signal. The gateway device receives a node response message from a first node device that includes a duration value indicating a time between a receipt of the transmitted synchronization signal and a detected zero crossing. The gateway device compares the duration value against duration values received from node devices with a known phase connection and determines a phase of the first node device based on the comparison.

20 Claims, 6 Drawing Sheets

SYSTEMS AND METHODS FOR PHASE IDENTIFICATION USING RELATIVE PHASE ANGLE MEASUREMENTS

CROSS-REFERENCE TO RELATED APPLICATIONS

This application claims priority to, and the benefit of, previously filed U.S. Provisional Patent Application No. 63/047,442; filed Jul. 2, 2020, the entire contents of which are incorporated by reference herein.

FIELD

The embodiments disclosed herein relates to phase determination within power distribution networks.

BACKGROUND

In power distribution networks having multi-phase power provided to multiple distribution locations, it can be difficult to accurately determine a phase associated with each distribution location. Understanding the phase associated with each distribution location can be beneficial for improving maintenance, ensuring load balancing, reducing outage times, etc.

SUMMARY

According to one aspect, a system for determining a phase of a device is provided. The system includes a number of gateway devices. Each of the gateway devices is in electronic communication with one or more node devices connected to a power distribution network and having a memory and one or more electronic processors. The electronic processors are configured to transmit a synchronization signal and receive a node response message from a first node device of the one or more node devices. The node response message includes a duration value indicating a duration between a receipt of the transmitted synchronization signal and a detected zero crossing. The electronic processors are further configured to compare the duration value against duration values received from at least a second node device with a known phase connection, determine a phase of the first node device based on the comparison, and store the phase of the first node device in the memory.

In another aspect, a method for determining a phase at a node device connected to a power distribution network is provided. The method includes transmitting a first synchronization signal to one or more node devices. The method also includes receiving a data message from a first device of the one or more node devices, wherein the data message includes a duration value. The method includes comparing the duration value received from the first node device against duration values received from at least a second node device with a known phase connection, determining a phase of the first node device based on the comparison, and storing the phase of the first node device in a memory of the gateway device.

In another aspect, a method for determining an electrical phase for one or more devices within a power distribution network is provided, according to some embodiments. The method includes receiving, at one or more devices a first synchronization signal and determining a zero crossing of an AC waveform of the power distribution system occurring immediately subsequent to receiving the first synchronization signal. The method also includes calculating a duration value between the receipt of the first synchronization signal and the determined zero crossing, and generating a data message comprising the duration value, a node identification value, and a synchronization ID value. The method also includes transmitting the data message to one or more gateway devices using a wireless communication protocol.

Other aspects of the technology will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
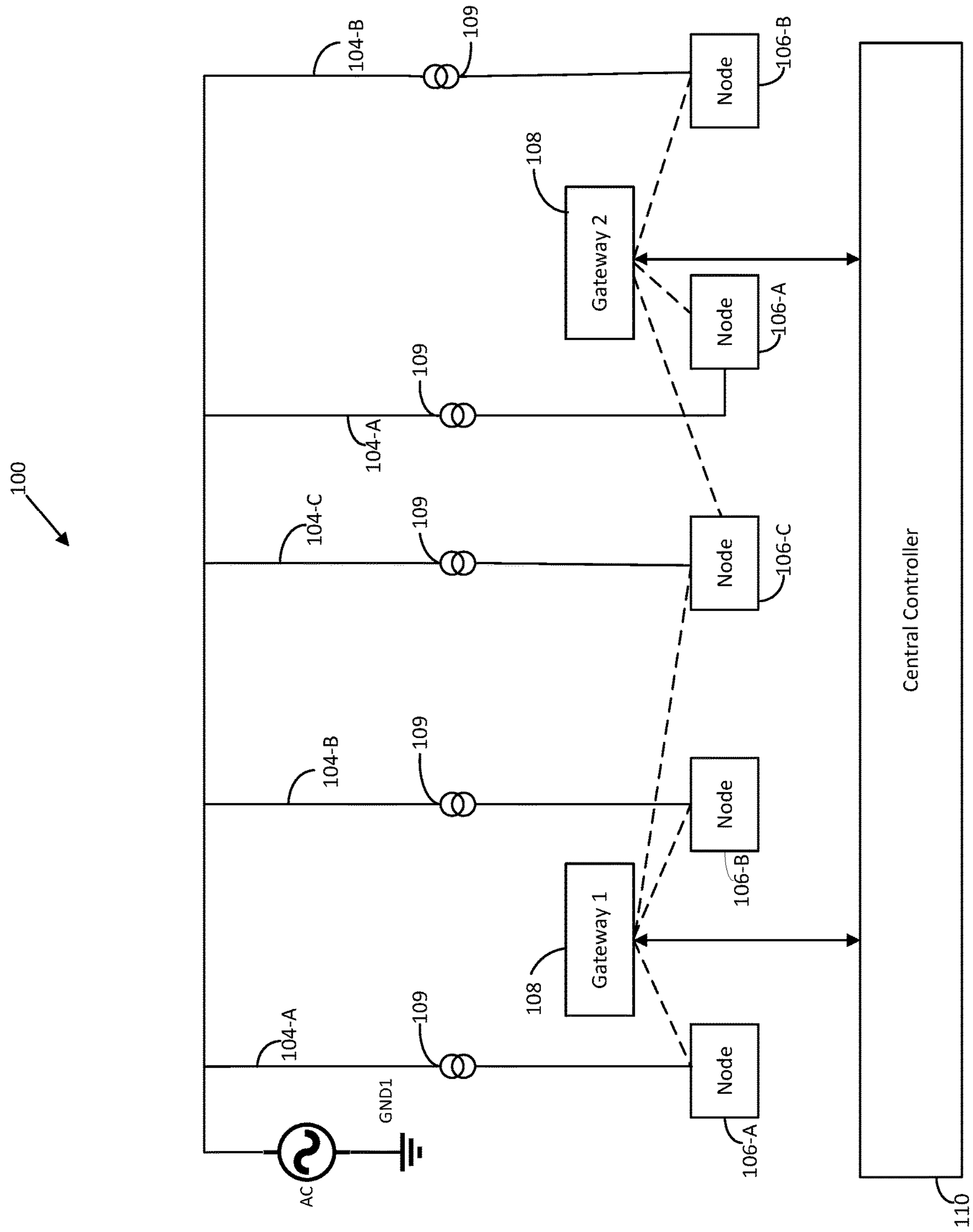
FIG. 1 is a block diagram illustrating one exemplary embodiment of a phase determination system, according to some embodiments.

FIG. 1 illustrates an example phase determination system 100, in accordance with an embodiment of the disclosure. The phase determination system 100 includes a power distribution network 104 and one or more node devices 106. In one embodiment, the node devices 106 may be a metering device, such as electrical metering devices (for example, residential, commercial, industrial, etc.). In other embodiments, the node devices 106 are coupled to metering devices, such as via an electrical coupling. The node devices 106 may be mechanically, electrically, and/or communicatively connected to aspects of the power distribution network 104. In further examples, the node devices 106 may be sensors, distribution automation devices, power monitors, switchgear, and the like. The system 100 may further include one or more gateway devices 108. In some examples, the gateway devices 108 may be data collection units ("DCU").

As illustrated in FIG. 1, the node devices 106 may be connected to transformers 109 (e.g., distribution transformers that step-down medium voltage to low voltage). The gateways 108 may be wirelessly connected to the node devices 106 to facilitate communication between the gateways 108 and the node device 106. For example, a gateway 108 may be connected to one or more node devices 106 using one or more wireless protocols, such as cellular (e.g.

3G, 4G, LTE, CDMA, etc.), RF, or other applicable wireless protocols. The gateways 108 may further be in communication with a central controller 110. The gateways 108 may communicate with the central controller 110 via a wireless communication protocol, such as those described above. In some examples, the gateways 108 may communicate with the central controller 110 via a wired connection, such as via a wired internet connection. However, other wired connections are also contemplated. The central controller 110 may be a server-based controller, a cloud-based controller, or other centralized computing system. In some examples, one of the gateways 108 may be configured to act as the central controller 110.

In one embodiment, the power distribution network 104 comprises distribution lines each adapted to carry electric power having different wiring phases. For example, the power distribution network 104 may be a three-phase power distribution network (e.g. including Phase A, B, and C). In other examples, the power distribution network may include more than three phases, such as phases A, AB, B, BC, C, CA. In one embodiment, a distribution line 104-A may be adapted to carry electric power on Phase A to one or more node devices 106-A, a distribution line 104-B may be adapted to carry electric power on Phase B to one or more node devices 106-B, and a distribution line 104-C may be adapted to carry electric power having Phase C to one or more node devices 106-C. In one exemplary embodiment, distribution lines of the power distribution network 104 may carry electric power having a combination of Phase A, Phase B, and/or Phase C to node devices 106. For example, when the system 100 includes delta-Y and/or Y-delta transformers the phases of the outputs of these transformers will not be pure Phase A, Phase B, or Phase C, but instead may be a combination of Phase A, Phase B, and/or Phase C.

The node devices 106 may be placed on the power distribution network 104 at an endpoint within the distribution network 104. Example endpoints may include residential or commercial locations. In other embodiments the node devices 106A-C may be placed at intermediate locations within the distribution network 104, such as commercial or light industrial substations. In some embodiments, the node devices 106 may include a communication device capable of wirelessly communicating with one or more gateways 108. In some embodiments, the gateways 108 are placed at multiple locations within the system 100 to facilitate communication with the node devices 106 as needed. For example, in some embodiments, the gateways 108 may be located within 5-10 miles of node devices 106 to ensure communication with the node devices 106. In some implementations, the gateways 108 may be mounted to power line poles at specified intervals or geographic locations to ensure proper coverage.

Figure 2:
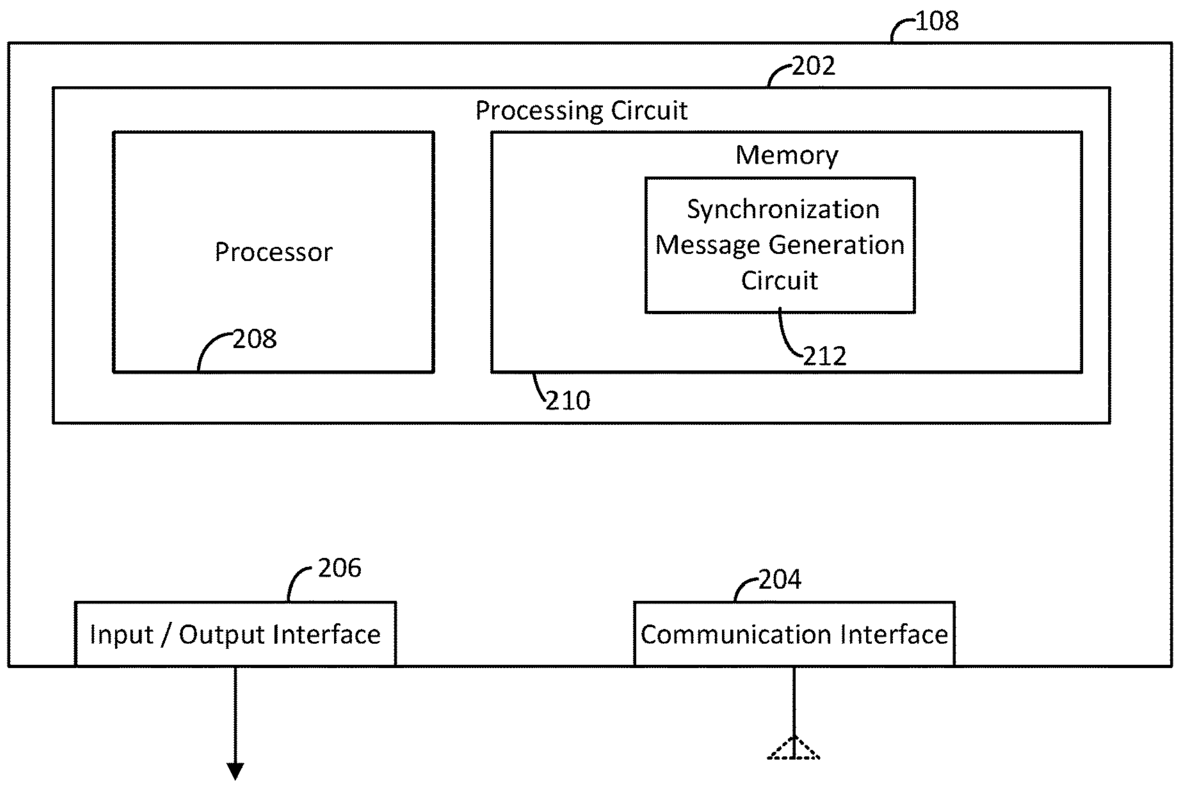
FIG. 2 is a block diagram illustrating one exemplary embodiment of the gateway devices of FIG. 1, according to some embodiments.

Turning now to FIG. 2, a block diagram of a gateway 108 is shown, according to some embodiments. The gateway 108 may be a standalone device, or may be a part of one or more devices, such as power meters, switchgear, etc. As shown in FIG. 2, the gateway 108 includes a processing circuit 202, a communication interface 204, and an input/output ("I/O") interface 206. The processing circuit 202 includes an electronic processor 208 and a memory 210. The processing circuit 202 may be communicably connected to one or more of the communication interface 204 and the I/O interface 206. The electronic processor 208 may be implemented as a programmable microprocessor, an application specific integrated circuit (ASIC), one or more field programmable gate arrays (FPGA), a group of processing components, or with other suitable electronic processing components.

The memory 210 (for example, a non-transitory, computer-readable medium) includes one or more devices (for example, RAM, ROM, flash memory, hard disk storage, etc.) for storing data and/or computer code for completing or facilitating the various processes, layers, and modules described herein. The memory 210 may include database components, object code components, script components, or other types of code and information for supporting the various activities and information structure described in the present application. According to one example, the memory 210 is communicably connected to the electronic processor 208 via the processing circuit 202 and may include computer code for executing (for example, by the processing circuit 202 and/or the electronic processor 208) one or more processes described herein.

The communication interface 204 is configured to facilitate communication between the gateway 108 and one or more external devices or systems, such as a node device 106, the central controller 110, and/or one or more other gateways 108. The communication interface 204 may be, or include, wireless communication interfaces (for example, antennas, transmitters, receivers, transceivers, etc.) for conducting data communications between the gateway 108 and one or more external devices, such as the node devices 106, the central controller 110, and/or one or more other gateways 108. In some embodiments, the communication interface 204 utilizes a proprietary protocol for communicating with the node devices 106, the central controller 110, and/or one or more other gateways 108. For example, the proprietary protocol may be an RF-based protocol configured to provide efficient and effective communication between the gateway 108 and other devices. In other embodiments, alternative wireless communication protocols may also be used, such as cellular (3G, 4G, 5G, LTE, CDMA, etc.), Wi-Fi, LoRa, LoRaWAN, Z-wave, Thread, and/or any other applicable wireless communication protocol.

The I/O interface 206 may be configured to interface directly with one or more devices, such as a power supply, a power monitor, etc. In one embodiment, the I/O interface 206 may utilize general purpose I/O (GPIO) ports, analog inputs, digital inputs, etc.

As described above, the memory 210 may be configured to store various processes, layers, and modules, which may be executed by the electronic processor 208 and/or the processing circuit 202. In one embodiment, the memory 210 includes a synchronization message generation circuit 212. The synchronization message generation circuit 212 is adapted to generate a synchronization message for establishing a common durational reference between gateway 108 and one or more node devices 106. In one embodiment, the synchronization message is transmitted via the communication interface 204, such as via the wireless communication protocols described above. In one embodiment, the synchronization message is a time synchronization message. In other embodiments, the synchronization message may be a counter signal, a pulse, a synchronization beacon, or other unique signal transmitted to all devices within a range of the gateway device 108. A time synchronization message may include a time value, such as provided by a real time clock, or other synchronized clock signal used to identify the time that the synchronization message was transmitted. A synchronization beacon may include a unique ID value based at least in part on one or more parameters associated with the transmission of the synchronization message.

Figure 3:
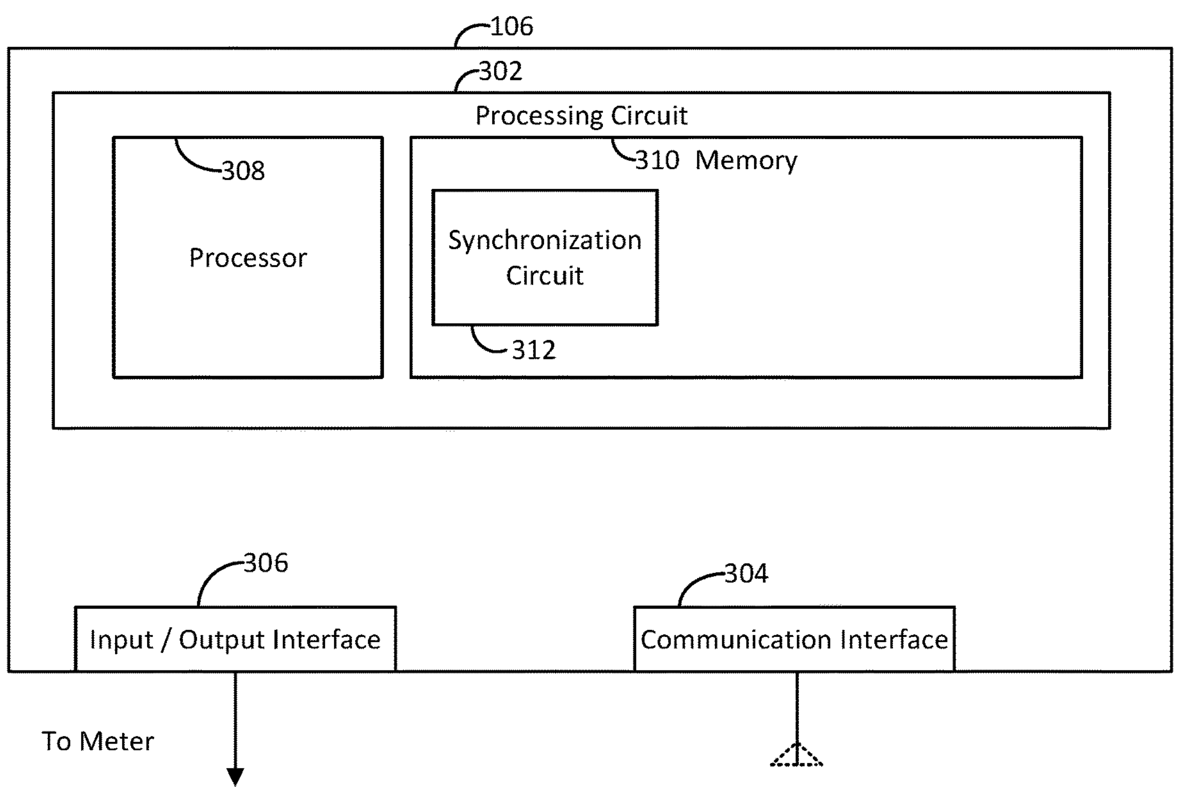
FIG. 3 is a block diagram illustrating one exemplary embodiment of the node devices of FIG. 1, according to some embodiments.

Turning now to FIG. 3, a block diagram of a node device 106 is shown, according to some embodiments. The node device 106 may be a standalone device, or may be a part of one or more devices, such as a power meter. As shown in FIG. 3, the node 106 includes a processing circuit 302, a communication interface 304, and an input/output ("I/O") interface 306. The processing circuit 302 includes an electronic processor 308 and a memory 310. The processing circuit 302 may be communicably connected to one or more of the communication interface 304 and the I/O interface 306. The electronic processor 308 may be implemented as a programmable microprocessor, an application specific integrated circuit (ASIC), one or more field programmable gate arrays (FPGA), a group of processing components, or with other suitable electronic processing components.

The memory 310 (for example, a non-transitory, computer-readable medium) includes one or more devices (for example, RAM, ROM, flash memory, hard disk storage, etc.) for storing data and/or computer code for completing or facilitating the various processes, layers, and modules described herein. The memory 310 may include database components, object code components, script components, or other types of code and information for supporting the various activities and information structure described in the present application. According to one example, the memory 310 is communicably connected to the electronic processor 308 via the processing circuit 302 and may include computer code for executing (for example, by the processing circuit 302 and/or the electronic processor 308) one or more processes described herein.

The communication interface 304 is configured to facilitate communication between the node 106 and one or more external devices or systems, such as a gateway 108. The communication interface 304 may be or include wireless communication interfaces (for example, antennas, transmitters, receivers, transceivers, etc.) for conducting data communications between the node 106 and one or more external devices, such as the gateway 108, other node devices 106, and/or the central controller 110. In some embodiments, the communication interface 304 utilizes a proprietary protocol for communicating with the gateways 108, other node devices 106, and/or the central controller 110. For example, the proprietary protocol may be an RF-based protocol configured to provide efficient and effective communication between the gateway 108, other node devices 106, the central controller 12, and/or other devices. In other embodiments, other wireless communication protocols may also be used, such as cellular (3G, 4G, 5G, LTE, CDMA, etc.), Wi-Fi, LoRa, LoRaWAN, Z-wave, Thread, and/or any other applicable wireless communication protocol.

The I/O interface 306 may be configured to interface directly with one or more devices, such as a power supply, a meter, etc. In one embodiment, the I/O interface 306 may utilize general purpose I/O (GPIO) ports, analog inputs, digital inputs, etc. The I/O interface 306 may be configured to receive data information, such as power usage, historical data, etc.

As described above, the memory 310 may be configured to store various processes, layers, and modules, which may be executed by the electronic processor 308 and/or the processing circuit 302. The memory 310 may include a synchronization circuit 312. The synchronization circuit 312 may be configured to receive the synchronization message from the gateway 108, detect a zero crossing on a power line coupled to the node 106, and determine a duration between the receipt of the synchronization message and the detected zero crossing, as will be described in more detail below. For example, the duration may be a time difference between the receipt of the synchronization message and the detected zero crossing. In other examples, the duration may be based on a count value difference between the receipt of the synchronization message and the detected zero crossing. Other durations are also contemplated herein.

Figure 4:
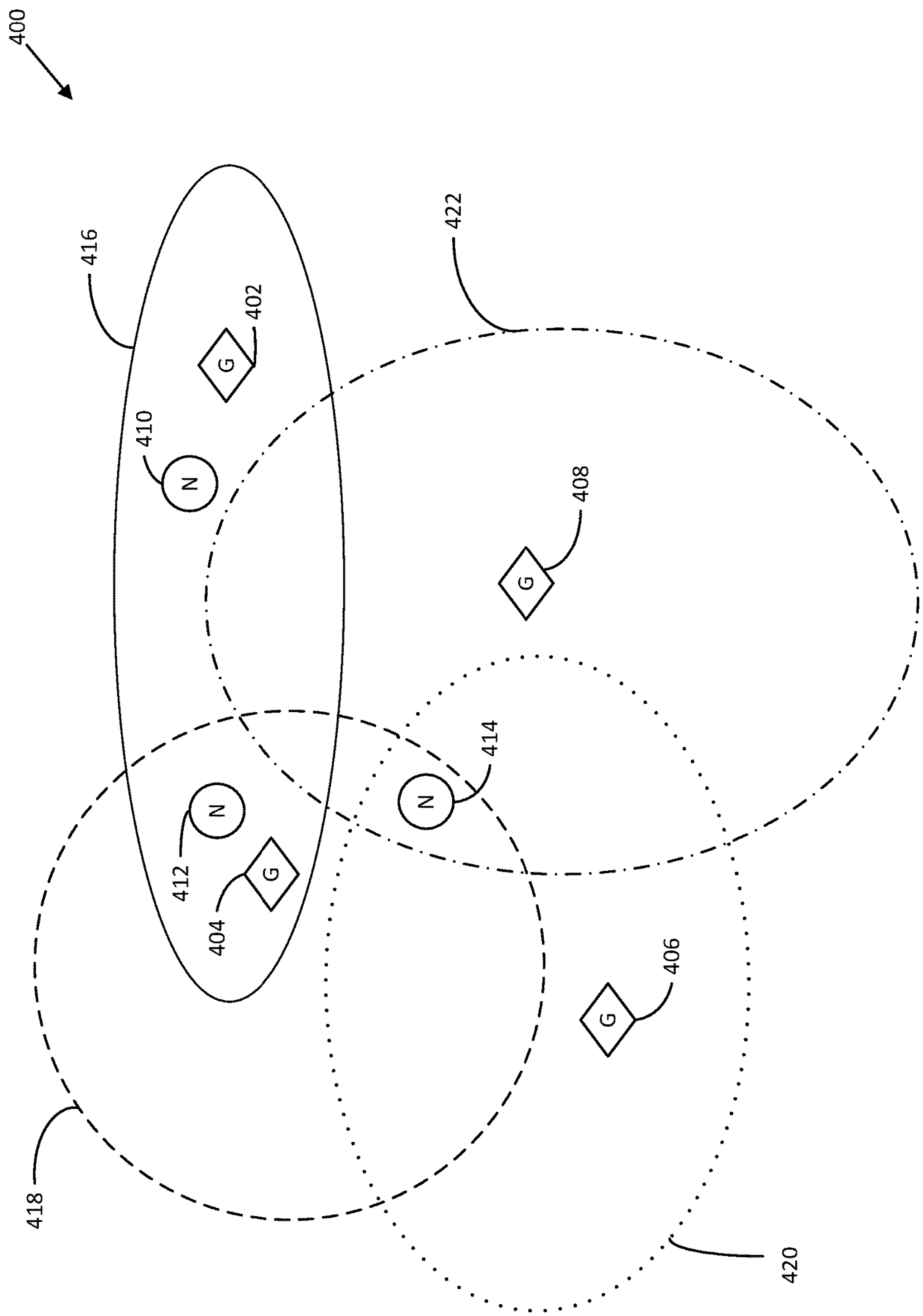
FIG. 4 is network diagram illustrating one exemplary embodiment of the phase determination system, according to some embodiments.

Turning now to FIG. 4 a network diagram shows a network 400 of gateways and node device, according to some embodiments. In one embodiment, the gateways may be similar to the gateways 108 and the node devices may be similar to the node devices 106 described above. As shown in FIG. 4, the network 400 includes a number of gateways 402, 404, 406, 408, and a number of nodes devices, 410, 412, 414. Each of the gateways 402, 404, 406, 408 may have an associated wireless coverage area associated therewith, as described above. For example, as shown in FIG. 4, gateway 402 has coverage area 416, gateway 404 has coverage area 418, gateway 406 has coverage area 420, and gateway 408 has coverage area 422.

As shown in FIG. 4, the different coverage areas 416, 418, 420, 422 may have various overlapping areas. One or more node devices, 410, 412, 414 may be within the coverage area of one or more gateways 402, 404, 406, 408. For example, node device 410 and node device 412 are located within the coverage area 416 of gateway 402. Node device 412 is also within the coverage area 418 of gateway 404. Node device 414 is located within the coverage area 418 of gateway 404, coverage area 420 of gateway 406, and coverage area 422 of gateway 408. Thus, different gateways may communicate with different node devices based on various conditions affecting the RF signal, such as distance, weather, obstructions, atmospheric conditions, etc.

As will be described in more detail below with respect to FIGS. 5 and 6, the gateways 402, 404, 406, and 408 may be configured to send out one or more synchronization messages to determine a phase associated with one or more of the node devices 410, 412, 414. The synchronization messages may utilize the synchronization messages described above. For example, gateway 402 may send out a synchronization message to all node devices within the coverage area 416 (e.g., node 410 and node 412). Node device 410 and node device 412 receive the message and capture a unique ID associated with the received message. Node device 410 and node device 412 then determine a duration between the receipt of the synchronization message and the next zero crossing of the AC power signal associated with each node device 410, 412.

Once the node devices 410, 412 determine the duration between the receipt of the message and the zero crossing, the node devices 410, 412 may transmit the information to a central computer, such as central controller 110 described above. In some embodiments, the central computer may be one or more of the gateways 402, 404, 406, 408. In one embodiment, the node devices 410, 412 transmit the information to one or more of the gateways, such as gateway 402, which may then process the information or re-transmit the information to a central controller, such as central controller 110.

Gateways 404, 406, 408 may then send out their own respective synchronization messages, which results in four different grouping of node devices (i.e. between nodes 410, 412, 414) with relative phases between the node devices. In the example of FIG. 4, the phase of the node device 410 may be known. For example, the node device 410 may be configured to have a set phase, such as "A" phase. In other examples, the gateways 402, 404, 406, 408 and or a central controller may know the phase associated with node device 410. Using the known phase of node device 410, the remaining node devices within the coverage area 416 can be determined based on their measured duration. As only those node devices within the coverage area 416 received the same synchronization message, only they can be compared against the known phase of node 410.

As node device 412 is within the coverage area 416, the phase of node device 412 can be determined as described above. As the phase of node device 412 is known, subsequent synchronization messages sent via gateway 404 can be used to determine the phase of other node devices within coverage area 418, as node device 412 is also located within coverage area 418 associated with gateway 404. This can continue for other gateways with overlapping coverage areas, thereby allowing the phase of additional node devices to be determined.

Figure 5:
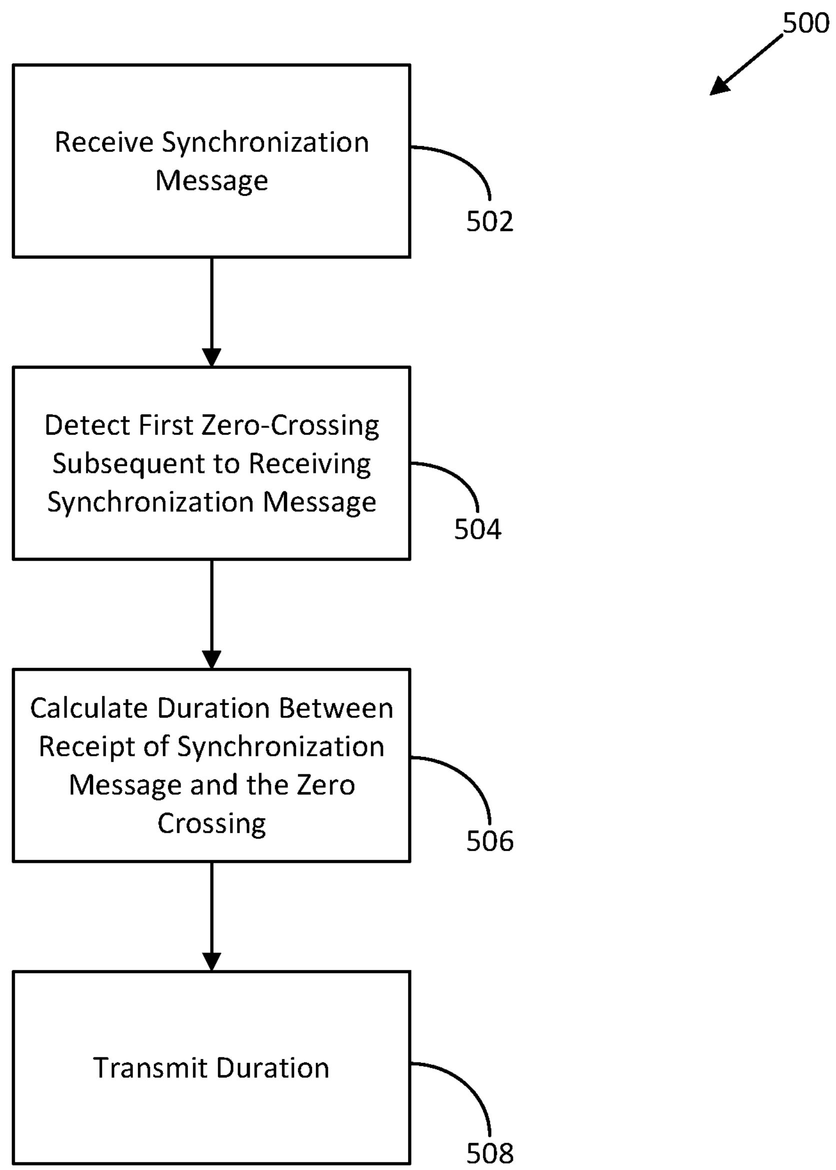
FIG. 5 is a flow chart illustrating one exemplary embodiment of a method for processing synchronization signals, according to some embodiments.

Turning now to FIG. 5, a process 500 for processing a received synchronization message is described, according to some embodiments. In one embodiment, the process 500 is performed by a node, such as node device 106 described above, and is described with regards to the system 100 described above. At process block 502, the node 106 receives a synchronization message from a gateway, such as gateway 108 described above. In one embodiment, the synchronization message is transmitted by a gateway 108. The synchronization message may include various information, such as a unique identifier, a time stamp, a sender identification (e.g. gateway identification), and the like. This information may be used by the node device 106 to discriminate between different received synchronization signals from multiple gateways 108.

At process block 504, the node device 106 detects a first zero-crossing event subsequent to receiving the synchronization message. At process block 506, the node 106 calculates a duration (delta) between the receipt of the synchronization message and the detected zero-crossing. In one embodiment, the duration is a time difference in degrees between a phase value at the time of transmission of the synchronization message and the subsequent zero crossing detected at a receiving node device 106. In other embodiments, the duration is a time difference in degrees between a phase value at the time of receiving the synchronization message and the subsequent zero crossing detected at a receiving node device 106. The determined duration is then transmitted at process block 508. In one embodiment, the node device 106 transmits the determined duration to a gateway 108, such as the gateway 108 that transmitted the synchronization message. In other embodiments, the node device 106 may transmit the duration to a central controller, such as central controller 110 described above. In some examples, the node device 106 may generate a message containing the determined duration between the received synchronization message and the detected zero crossing. The synchronization message may further include information such as a node device identifier, a time stamp, the gateway identification of the gateway 108 that transmitted the synchronization message, etc. In some embodiments, the synchronization message may include a known phase associated with the node device, where known.

Figure 6:
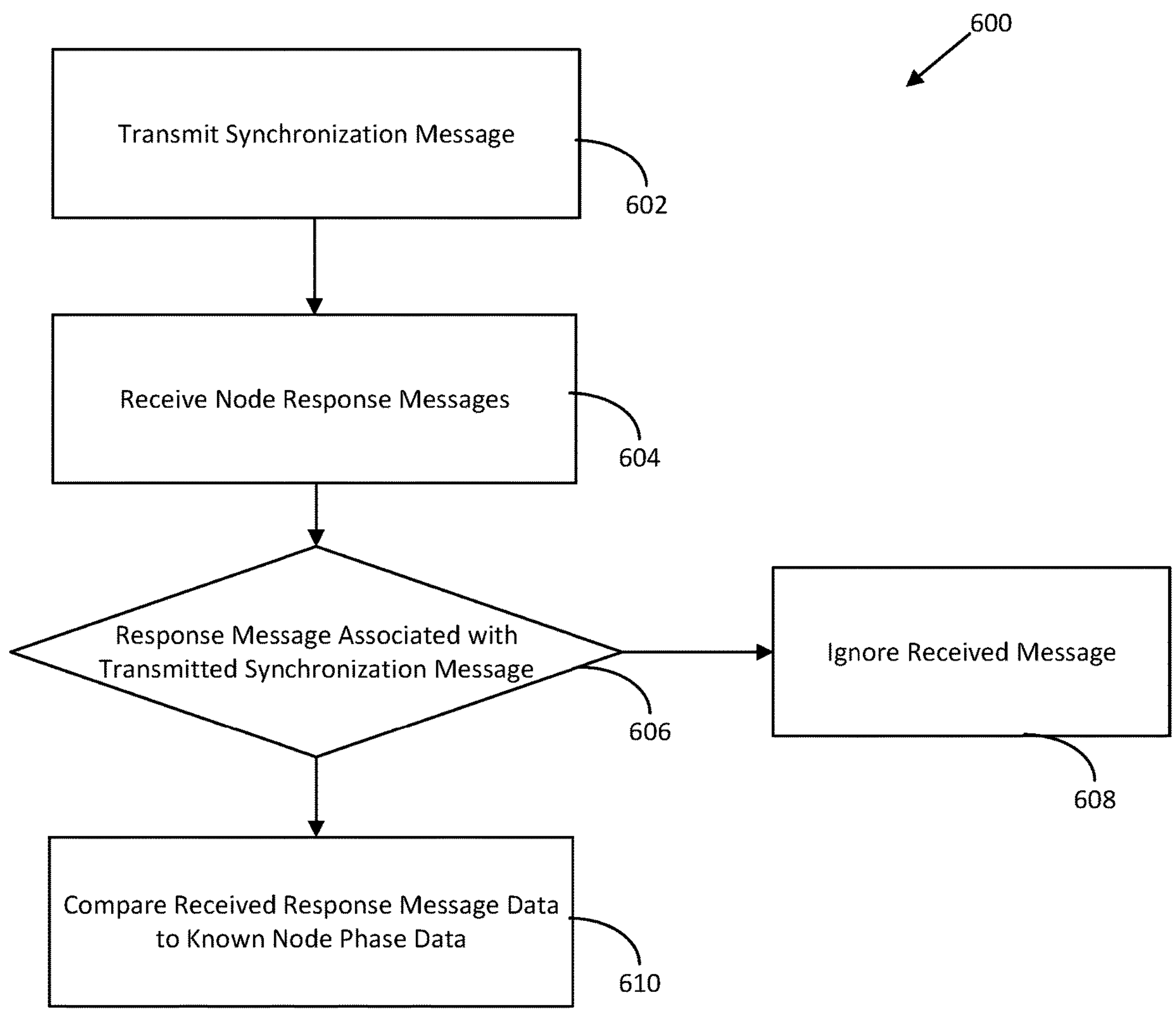
FIG. 6 is a flow chart illustrating one exemplary embodiment of a method for processing node response messages, according to some embodiments.

Turning now to FIG. 6, a process 600 for processing node response messages is shown, according to some embodiments. The process 600 is described with regards to system 100 described above but may be implemented using other systems or devices as described herein. At process block 602, a synchronization message is transmitted. As described above, the synchronization message may be transmitted by one or more gateways, such as gateway 108, described above. In some embodiments, a central controller, such as central controller 110 may provide an instruction to one or more of the gateways 108 to transmit the synchronization messages to the node devices, such as node devices 106. As described above, the synchronization messages may be transmitted wirelessly by the gateways 108 and may be received by any node devices 106 within a wireless coverage area of the gateway 108. In some embodiments, the synchronization messages are sent at predetermined times. In other embodiments, the synchronization messages may be sent based on a command sent from a user, such as via the central controller 110. As described above, the synchronization message may include various information, such as a unique identifier, a time stamp, a sender identification (e.g. gateway identification), or other information as required for a given application.

At process block 604, one or more gateways 108 receive a node response message. As described above, the node devices 106 may wirelessly transmit the response message using one or more wireless communication protocols, and the message may be received by any gateways 108 that have a wireless coverage area that includes the node device 106. As described above, the node response message may include the duration between the received synchronization message and a subsequent detected zero crossing as well as information such as a node device identifier, a time stamp, a gateway identification of the gateway 108 that transmitted the synchronization message, the synchronization message ID, etc.

At process block 606, the gateway 108 determines whether the received node response message is in response to the synchronization message transmitted by the gateway. For example, the gateway 108 may determine whether the received node response message is in response to the synchronization message based on the gateway identification information within the node response message. For example, where the gateway identification information within the node response message indicates that the node device 106 is responding to a synchronization message sent via the gateway 108 receiving the node response message, the gateway 108 determines that the node response message is associated with the previously transmitted synchronization message. In other examples, the gateway 108 may determine whether the received node response message is in response to the synchronization message based on matching the synchronization message ID to a transmitted synchronization message having the same synchronization message ID.

In response to determining that the node response message is not associated with a previously transmitted synchronization message, the gateway 108 ignores the received node response message at process block 608. In response to determining that the node response message is associated with a previously transmitted synchronization message, the gateway 108 forwards the node response message to a central controller, such as central controller 110, at process block 610. In some embodiments, the gateway 108 may add additional information to the forwarded node response message, such as whether the associated node has a defined phase, historical information, etc. In some embodiments, the gateway 108 communicates to the central controller 110 via a wireless connection. In other embodiments, the gateway 108 communicates to the central controller 110 via a wired connection. In some embodiments, the gateway 108 may be configured to transmit all received node response messages to the central controller 110, regardless of whether the node response message is in response to a synchronization message transmitted by said gateway 108. This can prevent lost node response messages due to changes in a radio range of a given node device 106 and/or gateway device 108. Thus, by forwarding all node response messages to the central controller 110, the number of node response messages received by the central controller 110 can be maximized.

Figure 7:
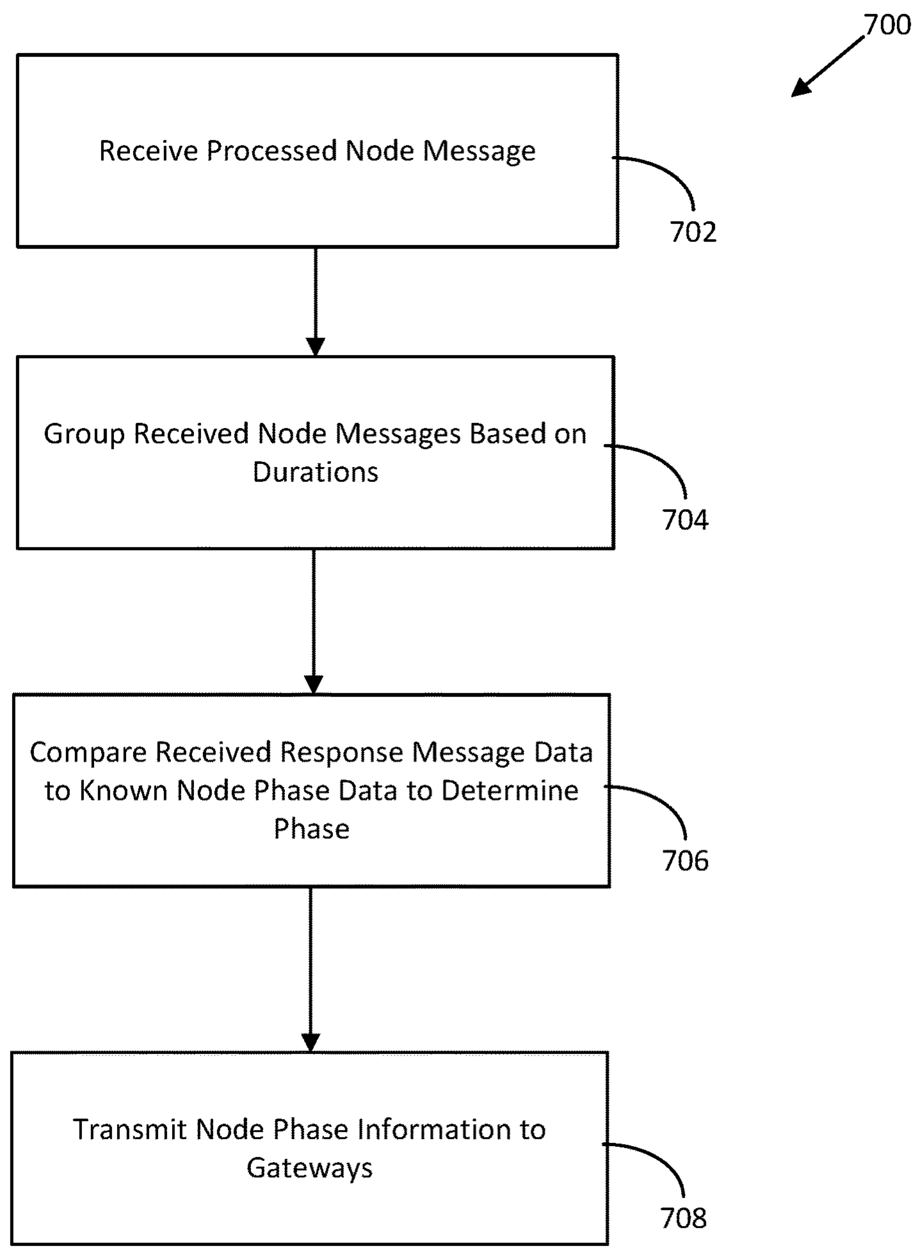
FIG. 7 is a flow chart illustrating one exemplary embodiment of a method for determining a phase of a node in a power distribution system, according to some embodiments.

Turning now to FIG. 7, a flow chart illustrating a process 700 for determining a phase of a node device 106 in a power distribution network such as power distribution network 104, is shown, according to some embodiments. In one embodiment, the process 700 is executed via a central controller, such as central controller 110 described above. In one example, the central controller 110 may be a gateway 108, as described above. In still further embodiments, individual gateways 108 may perform process 700. At process block 702, a processed node response message forwarded by a gateway 108 is received. As described above, the processed node response message may include information such as a duration between the received synchronization message and a subsequent detected zero crossing as well as information such as a node identifier, a time stamp, a gateway identification of the gateway that transmitted the synchronization message, the synchronization message ID, known phase of the node device 106, etc. Multiple processed node response messages may be received from multiple gateways 108 at the central controller 110.

At process block 704, the central controller 110 groups the received node response messages based on the reported durations between the received synchronization messages and a subsequently detected zero-crossing. In some embodiments, the received node response messages are grouped for each specific synchronization message. For example, the received node response messages may be grouped first by a synchronization message ID, and then second by a duration between the received synchronization message and subsequently detected zero-crossing.

At process block 706, the durations between the received synchronization message and subsequently detected zero-crossing for node devices with unknown phases are compared against the received synchronization message and subsequently detected zero-crossing for node devices with known phases. For example, where one group of node devices have a duration value of 100 ms, and a node device having a known phase also reports a duration value of 100 ms, the node devices 106 having an unknown phase can be grouped with the node devices having a known phase. Specifically, in response to the central controller 110 determining that the node devices 106 with unknown phases have substantially the same time duration as the node device 106 with the known phase, the central controller 110 determines that the nodes with the same durations are coupled to the same phase. In one embodiment, substantially is contemplated to be plus or minus 15° of difference. However, bucketization values of more than ±15° or less than ±15° are also contemplated. For example, where the duration value of a first group of node devices 106 is 100 ms for a given synchronization message, and the duration of a node device 106 with a known phase of A is the same for a given synchronization message, the central controller 110 can determine that the first group of node devices 106 are also coupled to Phase A.

By grouping durations into known categories, it becomes possible to not only relate similar node devices 106 together, but dissimilar node devices as well. Where a durational delay from a first node device 106 is 120°±15° later in time than a reference node device, and the reference node device 106 is on phase A, the central controller 110 can determine that the first node device 106 is on phase B. Where a duration from a second node device is 240°±15° later in time than the reference node device, and the reference node device 106 is on phase A, the central controller 110 can determine that the second node device 106 is on phase C. This bucketization process (with ±15° resolution) allows for as many as 12 phases to be supported. Other implementations may pursue 6 or even 3 phases. In some examples, the bucketization process may be used with tighter resolution, such as ±5%. Where a duration is outside of the ±5%, the central controller 110 may provide an indication that the node device 106 phase is unknown. This can improve the probability that all identified node phases are correctly determined. In the above examples, durational increments of 120° are described; however, durational increments of 30°, 60°, or other increments may also be used to determine a given phase of a node device 106. For example, by using 60° increments up to 6 phases may be determined, while using 30° increments allows for up to 12 phases to be determined, thereby increasing the available resolution of phases. Further, resolutions of ±15° to ±5° may be used as noted above.

Upon determining the phases of one or more node devices 106, the central controller 110 transmits the known phase information for the node devices 106 to the associated gateways at process block 708. For example, the central controller 110 may broadcast the phase information associated with a specific node device ID to various gateways 108 in the system. In some embodiments, the central controller 110 may only communicate the node device phases to those gateways 108 within a specific geographical range of the associated nodes to reduce the number and/or range of the transmissions required. In other examples, the central controller 110 may only transmit the node device 106 phase information to those gateways 108 which transmitted node response data from a given node device 106. The gateway 108 may then store the node ID and phase data in a memory. In other embodiments, the node device 106 phase information is further provided to the associated node device 106. The node devices 106 may then provide their known phase in subsequent node response messages.

In other embodiments, the determined phase information is not transmitted by the central controller 110, but rather stored in a memory of the central controller 110 for access by one or more users accessing the central controller 110 via a user interface.

The process 700 described above may be iterative in nature. For example, in some instances, for a given set of node response messages associated with a synchronization message, there may not be enough known nodes to determine all possible phases (e.g. A, B, C, and/or Neutral (N)) and combination of phases (e.g. for two phase connected devices). For example, the process may determine phase connections for devices, including AN, BN, CN, AB, BC, VA, NA (i.e. −AN), NB, NC, BA, CB, and AC phase connections. However, due to the overlapping nature of the wireless coverage areas described above, as more node phases are determined, the more subsequent phase determinations can be made. For example, returning to the network 400 described above in FIG. 4, only the phase of node 410 may be known initially, meaning that the synchronization messages transmitted by the gateways 404, 406, and 408 will not yield any results as none of the nodes within their respective coverage areas have a known phase. However, assuming that the determined duration of node 412 is determined to be within a set range (e.g. ±15%) of the duration of node 410 for a given synchronization message, the phase of node 412 can be determined and provided to other gateways, such as gateways 404, 406, and 408, or to a central controller, such as central controller 110 described above. Thus, the next time a synchronization message is output by gateway 404, the phase of node 412 (located within the coverage area 418) will be known, and can be used to determine the phase of other nodes within the coverage area, such as node 414. This process may be used iteratively, as once the phase of node 414 is determined, gateways 406, 408 will then have at least one node with a known phase within their respective coverage areas. As it is likely that each gateway will be in communication with multiple nodes, by iteratively identifying node phases for nodes within overlapping coverage areas, the determination of node phases can continue to increase as more node phases are determined. It is understood that the above example is for exemplary purposed only, and that the phase of node 412 can be determined based on comparison with other nodes with known phases, and/or based on known phase data at one or more of the gateway devices and/or the central controller.

What is claimed is:

1. A system for determining a phase of one or more nodes coupled to an electrical distribution system, the system comprising:

a plurality of gateway devices, each of the gateway devices in electronic communication with one or more node devices connected to a power distribution network and having a memory and one or more electronic processors configured to:

transmit a synchronization message;

receive a node response message from a first node device of the one or more node devices, wherein the node response message includes a duration value indicating a duration between a receipt of the transmitted synchronization message and a detected zero crossing;

compare the duration value against previous duration values received from at least a second node device with a known phase connection;

determine a phase of the first node device based on the comparison; and store the phase of the first node device in the memory.

2. The system of claim 1, wherein the one or more node devices are electrically coupled to a power distribution system and comprise a memory and one or more electronic processors configured to:

receive the synchronization message;

determine a zero crossing of an AC waveform of the power distribution system occurring subsequent to receiving the synchronization message;

calculate the duration value between the receipt of the synchronization message and the determined zero crossing;

generate the node response message comprising the duration value; and transmit the node response message.

3. The system of claim 2, wherein node response message further comprises a node identification value, and a synchronization ID value; and wherein the synchronization ID value is associated with the received synchronization message.

4. The system of claim 1, wherein the synchronization message is transmitted using a wireless communication protocol.

5. The system of claim 4, wherein the wireless communication protocol is an RF communication protocol.

6. The system of claim 1, wherein the one or more node devices are selected from a group consisting of electronic metering devices, sensors, and distribution automation devices.

7. The system of claim 1, wherein the one or more electronic processors of the gateway device are further configured to transmit the determined phase to the first node.

8. A method for determining a phase at a node device connected to a power distribution network, the method comprising:

transmitting a first synchronization message to one or more node devices;

receiving a data message from a first node device of the one or more node devices, wherein the data message includes a duration value;

comparing the duration value received from the first node device against duration values received from at least a second node devices with a known phase connection;

determining a phase of the first node device based on the comparison; and storing the phase of the first node device in a memory.

9. The method of claim 8, wherein the method is performed by a central computing device.

10. The method of claim 8, wherein the method is performed by a plurality of gateway devices in electronic communication with the one or more nodes.

11. The method of claim 8, wherein determining the phase of the first node device comprises determining a relationship of the duration value of the first node device to the durational values received from the at least one node device with a known phase connection, and wherein the phase of the first node device is determined to be one of the same phase, a +120° offset phase, and a −120° offset phase based on the determined relationship.

12. The method of claim 8, further comprising:

receiving, at the first node device, the first synchronization message;

determining, at the first node device, a zero crossing of an AC waveform of the power distribution system occurring immediately subsequent to receiving the first synchronization message;

calculating, at the first node device, the duration value between the receipt of the first synchronization message and the determined zero crossing;

generating, at the first node device, the data message comprising the duration value, a node identification value, and a synchronization ID value; and transmitting, by the first node device, the data message.

13. The method of claim 12, wherein the synchronization ID value is associated with the received synchronization message.

14. The method of claim 12, further comprising:

receiving the determined phase at the first node device; and storing the determined phase in a memory of the first node device.

15. The method of claim 8, wherein the duration values received from the at least one node device with a known phase connection are determined based on the first synchronization message.

16. A method for determining a phase at a node device connected to a power distribution network, the method comprising:

transmitting a first synchronization message to one or more node devices;

receiving a data message from a first node device of the one or more node devices, wherein the data message includes a duration value;

comparing the duration value received from the first node device against duration values received from at least a second node devices with a known phase connection;

determining a phase of the first node device based on the comparison, wherein determining the phase of the first node device comprises determining a relationship of the duration value of the first node device to the durational values received from the at least one node device with a known phase connection, and wherein the phase of the first node device is determined to be one of the same phase, a +120° offset phase, and a −120° offset phase based on the determined relationship; and storing the phase of the first node device in a memory.

17. The method of claim 16, wherein the synchronization ID value is associated with the received synchronization message.

18. The method of claim 16, further comprising:

receiving, at the first node device, the first synchronization message;

determining, at the first node device, a zero crossing of an AC waveform of the power distribution system occurring immediately subsequent to receiving the first synchronization message;

calculating, at the first node device, the duration value between the receipt of the first synchronization message and the determined zero crossing;

generating, at the first node device, the data message comprising the duration value, a node identification value, and a synchronization ID value; and transmitting, by the first node device, the data message.

19. The method of claim 18, wherein the synchronization ID value is associated with the received synchronization message.

20. The method of claim 16, wherein the duration values received from the at least one node device with a known phase connection are determined based on the first synchronization message.

* * * * *